(12) United States Patent
Yamamoto

(10) Patent No.: US 10,770,223 B2
(45) Date of Patent: Sep. 8, 2020

(54) HIGH FREQUENCY COMPONENT

(71) Applicant: Murata Manufacturing Co., Ltd., Kyoto (JP)

(72) Inventor: Issei Yamamoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/156,184

(22) Filed: Oct. 10, 2018

(65) Prior Publication Data

US 2019/0043662 A1 Feb. 7, 2019

Related U.S. Application Data

(63) Continuation of application No. PCT/JP2017/007619, filed on Feb. 28, 2017.

(30) Foreign Application Priority Data

Apr. 11, 2016 (JP) .................................. 2016-078590

(51) Int. Cl.
*H01F 27/36* (2006.01)
*H03H 7/01* (2006.01)
(Continued)

(52) U.S. Cl.
CPC ......... *H01F 27/36* (2013.01); *H01F 17/0013* (2013.01); *H01F 27/40* (2013.01);
(Continued)

(58) Field of Classification Search
CPC .......... H03H 2001/0085; H03H 7/0115; H01F 27/36
(Continued)

(56) References Cited

U.S. PATENT DOCUMENTS 5,898,344 A * 4/1999 Hayashi ............... H05K 3/3405
331/67
2015/0070046 A1 3/2015 Takano et al.
2015/0126134 A1 5/2015 Lobianco et al.

FOREIGN PATENT DOCUMENTS

CN 103240541 B * 8/2014
JP H03-013000 A 1/1991
(Continued)

OTHER PUBLICATIONS

International Search Report for International Application No. PCT/JP2017/007619, dated May 30, 2017.
(Continued)

*Primary Examiner* — Rakesh B Patel
(74) *Attorney, Agent, or Firm* — Pearne & Gordon LLP

(57) ABSTRACT

The present disclosure is intended to reduce connection resistance between a shield film and a ground electrode, and to improve characteristics of the shield film. A high frequency component 1a includes a ceramic substrate 2, a ground electrode 3a disposed inside the ceramic substrate 2, a shield film 4 covering an upper surface 2a and lateral surfaces 2c of the ceramic substrate 2, and connecting portions 6a connecting the ground electrode 3a and the shield film 4, wherein the ground electrode 3a is formed using a conductive paste that contains a metal ingredient, powder, and a material constituting the ceramic substrate 2, and a weight rate of a metal ingredient in the connecting portions 6a is higher than that of the metal ingredient in the ground electrode 3a.

19 Claims, 7 Drawing Sheets

(51) Int. Cl.

| | | |
|---|---|---|
| *H05K 1/02* | (2006.01) | |
| *H01F 17/00* | (2006.01) | |
| *H01G 2/06* | (2006.01) | |
| *H01F 27/40* | (2006.01) | |
| *H01G 4/005* | (2006.01) | |
| *H01G 4/12* | (2006.01) | |
| *H01G 4/40* | (2006.01) | |
| *H03H 1/00* | (2006.01) | |
| *H05K 3/46* | (2006.01) | |
| *H05K 3/24* | (2006.01) | |
| *H05K 1/09* | (2006.01) | |

(52) U.S. Cl.
CPC ............. *H01G 2/065* (2013.01); *H01G 4/005* (2013.01); *H01G 4/12* (2013.01); *H01G 4/40* (2013.01); *H03H 7/0115* (2013.01); *H05K 1/0218* (2013.01); *H01F 2017/008* (2013.01); *H01F 2017/0026* (2013.01); *H03H 2001/0085* (2013.01); *H05K 1/092* (2013.01); *H05K 3/248* (2013.01); *H05K 3/4629* (2013.01); *H05K 2201/0338* (2013.01); *H05K 2201/0715* (2013.01)

(58) Field of Classification Search
USPC .................................................. 333/175, 185
See application file for complete search history.

(56) References Cited

FOREIGN PATENT DOCUMENTS

| | | |
|---|---|---|
| JP | 2005-276980 A | 10/2005 |
| JP | 2013-118119 A | 6/2013 |
| JP | 2015-056427 A | 3/2015 |
| JP | 2015-091135 A | 5/2015 |
| JP | 2015-144165 A | 8/2015 |

OTHER PUBLICATIONS

Written Opinion for International Application No. PCT/JP2017/007619, dated May 30, 2017.

* cited by examiner

PRIOR ART

HIGH FREQUENCY COMPONENT

This is a continuation of International Application No. PCT/JP2017/007619 filed on Feb. 28, 2017 which claims priority from Japanese Patent Application No. 2016-078590 filed on Apr. 11, 2016. The contents of these applications are incorporated herein by reference in their entireties.

BACKGROUND OF THE DISCLOSURE

Field of the Disclosure

The present disclosure relates to a high frequency component including a ceramic substrate and a shield film covering a surface of the ceramic substrate.

Description of the Related Art

A high frequency component mounted to a portable terminal device, etc. often includes a shield film for shielding the high frequency component against electromagnetic waves. As illustrated in FIG. 13, for instance, a high frequency component 100 disclosed in Patent Document 1 includes a ceramic substrate 101, a component 102 mounted to an upper surface of the ceramic substrate 101, an encapsulation resin layer 103 encapsulating the component 102, and a shield layer 104 covering not only an upper surface and lateral surfaces of the encapsulation resin layer 103, but also lateral surfaces of the ceramic substrate 101. Here, the component 102 is, for example, an RF-IC with the RF function. The shield film 104 is made of a conductive material and is connected to a conductive layer 105 that is exposed at the lateral surface of the ceramic substrate 101. The conductive layer 105 is electrically connected to a ground plane (ground electrode) inside the ceramic substrate 101. With the above-mentioned structure, shield characteristics of the shield film 104 are improved.

Patent Document 1: Japanese Unexamined Patent Application Publication No. 2015-91135 (see paragraphs 0045 and 0046, and FIG. 9)

BRIEF SUMMARY OF THE DISCLOSURE

The conductive layer 105 in the related-art high frequency component 100 is formed, for example, using a conductive paste that is a mixture of metal powder and an organic solvent. A part of materials constituting the ceramic substrate is often further added to the conductive paste to make the contraction timing and the coefficient of linear expansion of the conductive layer 105 in a firing process closer to those of the ceramic substrate. In such a case, the specific resistance of the conductive layer 105 becomes higher than that of a conductive layer (e.g., a lead frame) formed, for example, by etching a metal plate. This causes a problem that, when an end portion of the conductive layer 105 to which any ingredient other than metal ingredients is added is exposed at the lateral surface of the ceramic substrate and is connected to the shield film 104, the contact resistance between them increases and the shield characteristics degrade. In general, the above-mentioned type of high frequency component is manufactured by forming an assembly of many high frequency components together, and by cutting the high frequency components into individual pieces with a dicing machine. Furthermore, in order to obtain the ceramic substrate, a plurality of green sheets need to be fired after being laminated one above another. In some type of high frequency component, however, firing is performed after cutting the ceramic substrate into individual pieces. As a result of intensive studies, the inventor has found the following point. When the firing is performed after cutting the ceramic substrate into individual pieces, the gas used in the firing process adheres to the end portion of the conductive layer 105, which is exposed at the lateral surface of the ceramic substrate 101, or the end portion is oxidized. Therefore, the connection resistance between the shield film 104 and the conductive layer 105 increases, thus causing a possibility that the shield characteristics may further degrade. The inventor has further found the following point. In the case of the conductive layer 105 containing the material constituting the ceramic substrate 101, when the firing is performed after cutting the ceramic substrate into individual pieces, a firing reaction progresses earlier at the surface where the temperature is relatively high in comparison with the interior. Due to such a phenomenon, the material being present in the conductive layer and constituting the ceramic substrate is caused to flow toward the ceramic layer, thus causing a possibility that defects may generate in the conductive layer. Those defects may increase the connection resistance between the shield film and the conductive layer, and may degrade the shield characteristics in some cases.

The present disclosure has been made in consideration of the above-mentioned problems, and an object of the present disclosure is to, in a high frequency component including a shield film connected to a ground electrode that is exposed at a surface of the ceramic substrate, improve the shield characteristics of the shield film by reducing the connection resistance between the shield film and the ground electrode.

To achieve the above-mentioned object, the present disclosure provides a high frequency component including a ceramic substrate, a ground electrode disposed inside the ceramic substrate, a shield film covering at least a lateral surface among surfaces of the ceramic substrate, and a connecting portion connecting the ground electrode and the shield film, wherein a weight rate of a metal ingredient in the connecting portion is higher than a weight rate of a metal ingredient in the ground electrode.

With the features described above, since the ground electrode and the shield film are connected to each other by the connecting portion containing the metal ingredient at a relatively high weight rate, the shield characteristics of the shield film can be improved. Furthermore, the ground electrode may contain a material constituting the ceramic substrate with intent to make the contraction timing and the coefficient of linear expansion of the ground electrode closer to those of the ceramic substrate in a firing process. In that case, the ceramic substrate can be prevented from peeling off from the ground electrode while the improvement in characteristics of the shield film is ensured.

An end portion of the ground electrode may be exposed at the lateral surface of the ceramic substrate, and the connecting portion may cover a predetermined region of the lateral surface of the ceramic substrate, the predetermined region including a region where the end portion of the ground electrode is exposed. This case can provide a specific feature that the connecting portion covers the end portion of the ground electrode, which is exposed at the lateral surface of the ceramic substrate.

The connecting portion may be arranged inside the ceramic substrate in a state of an end portion of the connecting portion being exposed at the lateral surface of the ceramic substrate. This case can provide a specific feature that the connecting portion is arranged inside the ceramic substrate in the state of the end portion of the connecting portion being exposed at the lateral surface of the ceramic substrate.

The connecting portion may be made of a columnar conductor having one end connected to the ground electrode and the other end connected to the shield film. In this case, the connecting portion can be formed using a general interlayer connection conductor such as a via conductor.

The shield film may cover the lateral surface and one principal surface of the ceramic substrate, and the ceramic substrate may include an outer electrode formed on or in the other principal surface of the ceramic substrate. With those features, the shield characteristics of a chip component, such as an LC filter component or a chip capacitor, can be improved.

The ground electrode may contain a material forming the ceramic substrate. In this case, the difference in contraction timing and coefficient of linear expansion between the ground electrode and the ceramic substrate in the firing process can be reduced. Therefore, the ground electrode formed in a larger area than a wiring pattern can be prevented from peeling off from the ceramic substrate. Moreover, since the shield film and the ground electrode are connected with the connecting portion interposed between them, the connecting portion having lower specific resistance than the ground electrode, the shield characteristics of the shield film can be suppressed from degrading even when the ground electrode contains the material forming the ceramic substrate.

The weight rate of the metal ingredient among inorganic ingredients in the connecting portion may be not less than 95 wt % and not more than 100 wt %, and the weight rate of the metal ingredient among inorganic ingredients in the ground electrode may be not less than 75 wt % and not more than 95 wt %. Those features are suitable to prevent the ground electrode from peeling off from the ceramic substrate while an increase of the connection resistance between the connecting portion and the shield film is suppressed.

The connecting portion may be made of a plating layer. This feature is practically advantageous because the connecting portion can be formed as a plating layer.

The shield film may have a structure in which a Cu layer and a first stainless steel layer are successively laminated in the mentioned order starting from the lower layer side toward the upper layer side. This case can provide a specific feature that the shield film has a two-layer structure of the Cu layer and the first stainless steel.

The shield film may have a structure in which a second stainless steel layer is further laminated on the lower layer side of the Cu layer. This case can provide a specific feature that the shield film has a three-layer structure of the first stainless steel layer, the Cu layer, and the second stainless steel.

The shield film may have a structure in which a Cu layer, a stainless steel layer, and a plating layer are successively laminated in the mentioned order starting from the lower layer side toward the upper layer side.

The shield film may have a structure in which a plating layer, a Cu layer, and a stainless steel layer are successively laminated in the mentioned order starting from the lower layer side toward the upper layer side.

According to the present disclosure, since the ground electrode and the shield film are connected to each other by the connecting portion containing the metal ingredient at a relatively high rate, the shield characteristics of the shield film can be improved. Furthermore, since the ground electrode contains the material constituting the ceramic substrate, it is possible to reduce the difference in contraction timing and coefficient of linear expansion between the ground electrode and the ceramic substrate in the firing process. In that case, the ceramic substrate can be prevented from peeling off from the ground electrode while the improvement in the shield characteristics of the shield film is ensured.

Figure 2:
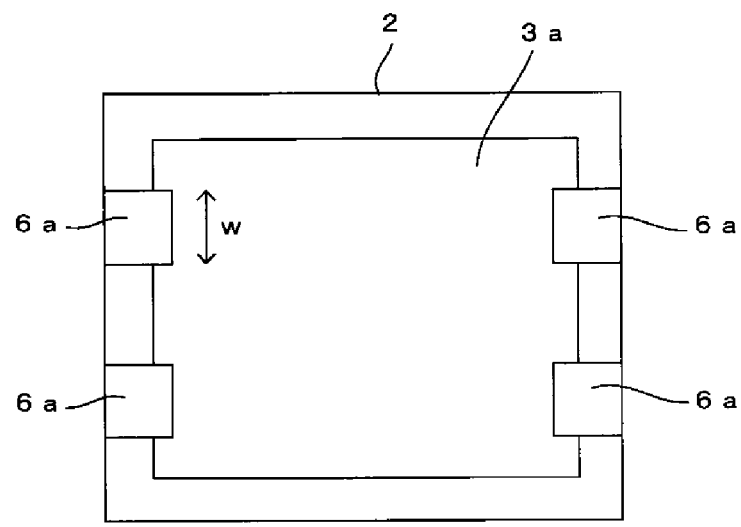
FIG. 2 is a plan view of a ground electrode and connecting portions in FIG. 1.
Figure 3A:
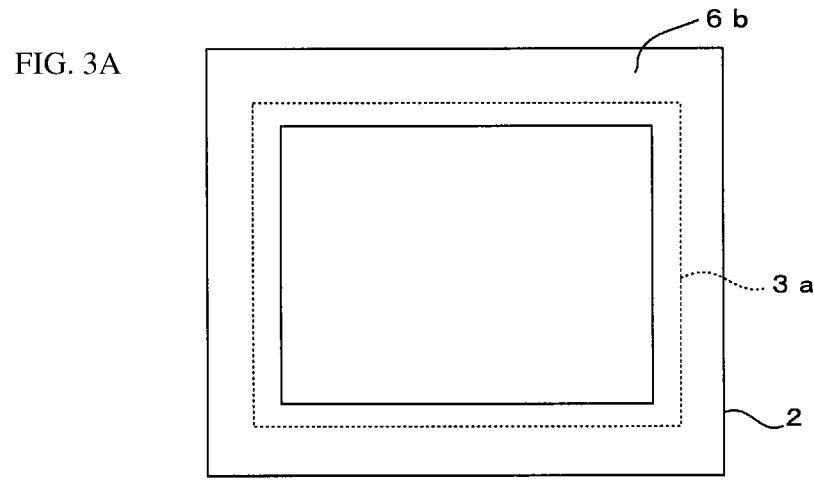
Figure 3B:
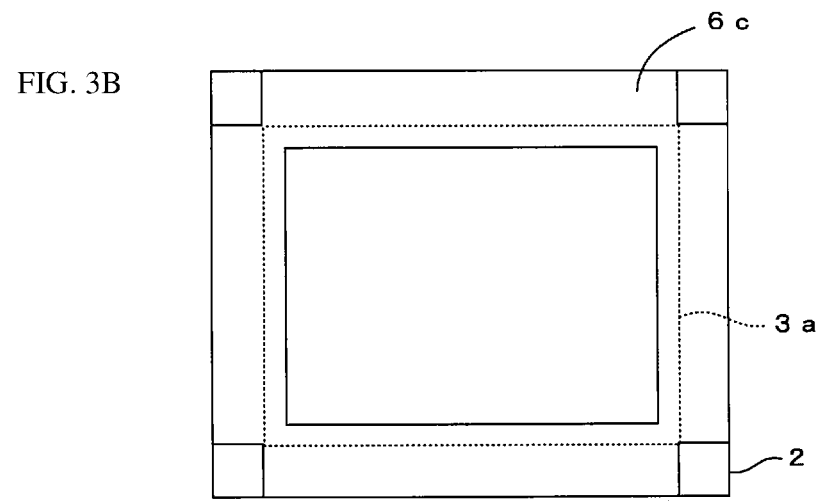

Each of FIGS. 3A and 3B illustrates modifications of the connecting portions in FIG. 2.

Figure 1:
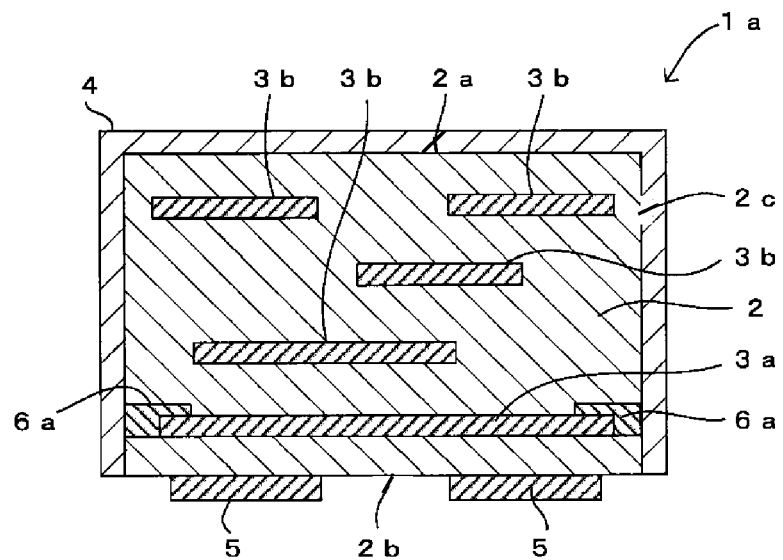
FIG. 1 is a sectional view of a high frequency component according to a first embodiment of the present disclosure.
Figure 4:
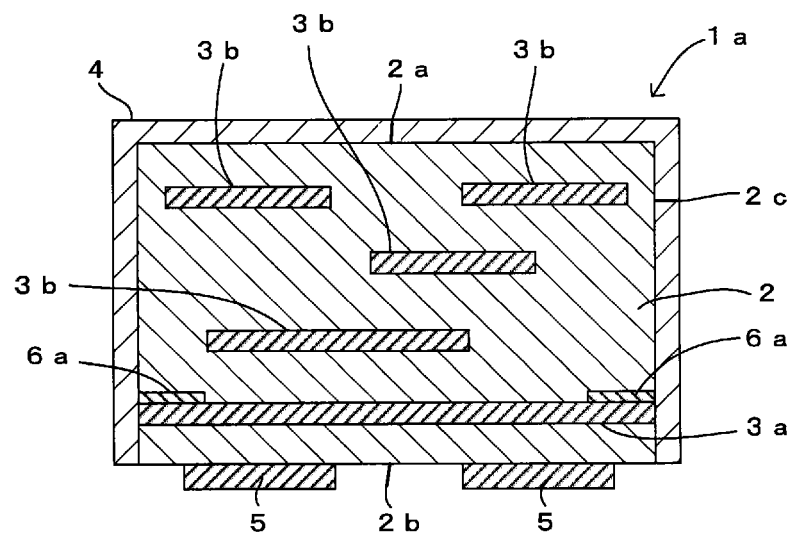

FIG. 4 illustrates a modification of the ground electrode in FIG. 1.

Figure 5:
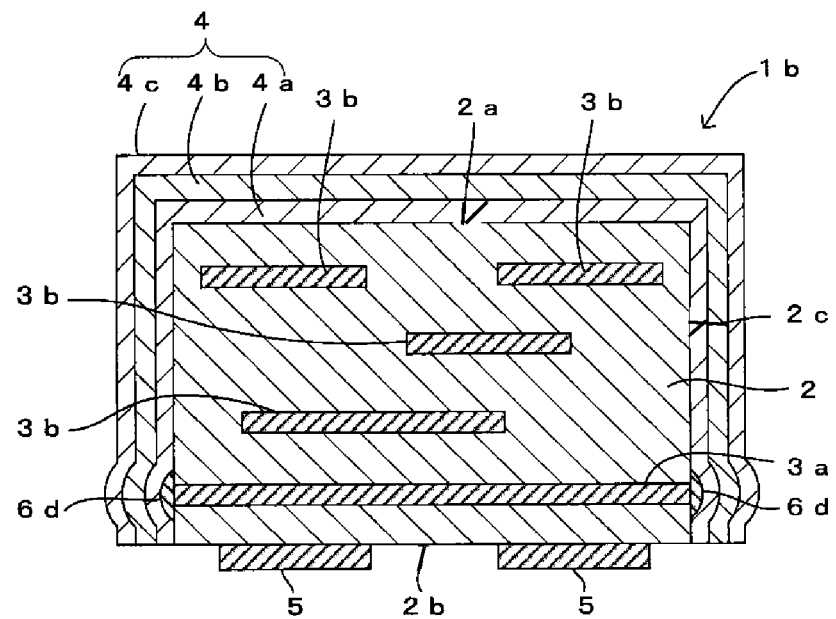

FIG. 5 is a sectional view of a high frequency component according to a second embodiment of the present disclosure.

Figure 6:
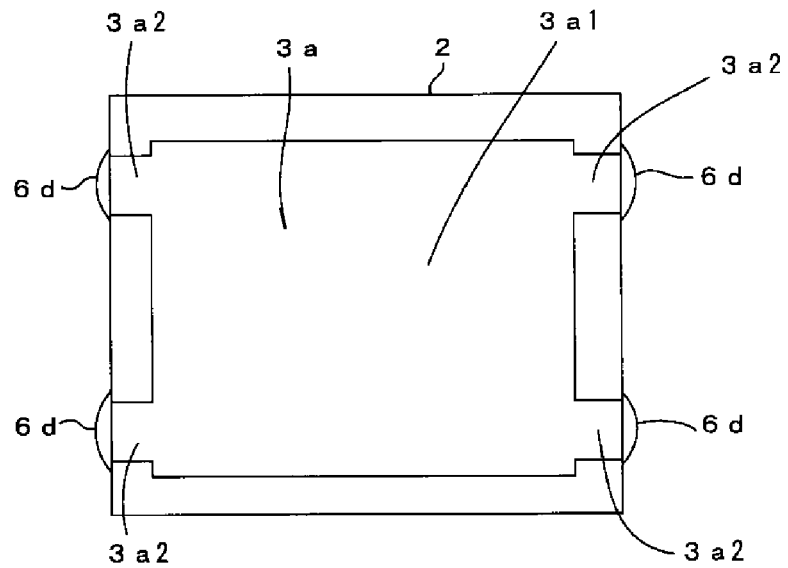

FIG. 6 is a plan view of a ground electrode and connecting portions in FIG. 5.

Figure 7:
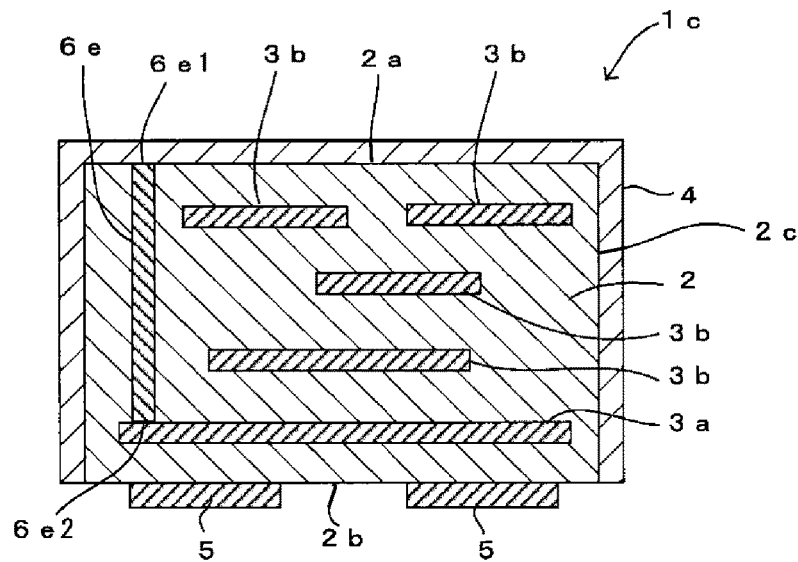

FIG. 7 is a sectional view of a high frequency component according to a third embodiment of the present disclosure.

Figure 8:
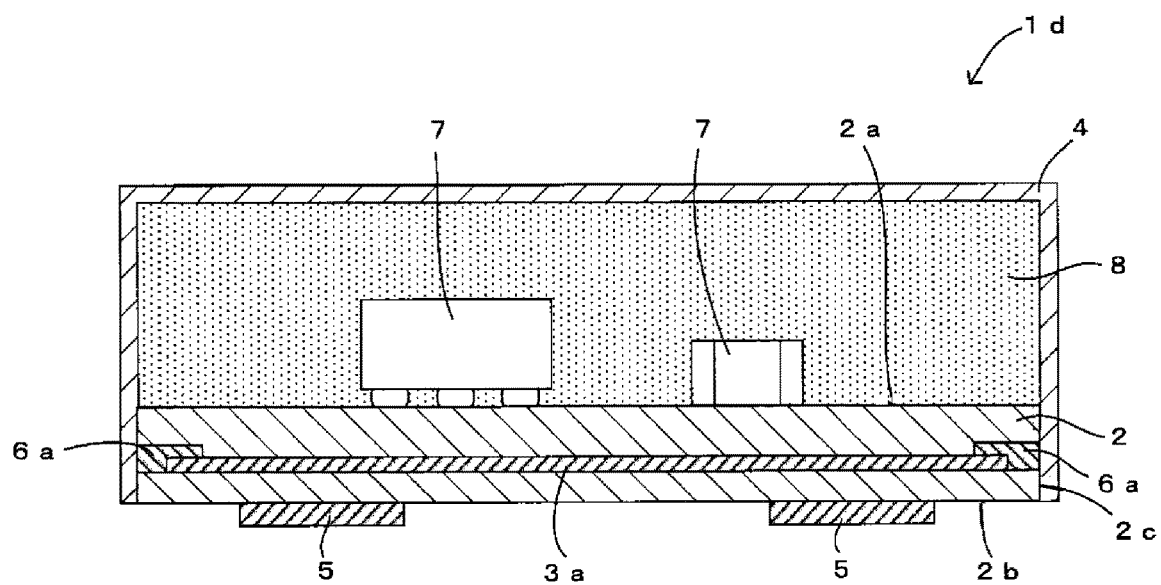

FIG. 8 is a sectional view of a high frequency component according to a fourth embodiment of the present disclosure.

Figure 9:
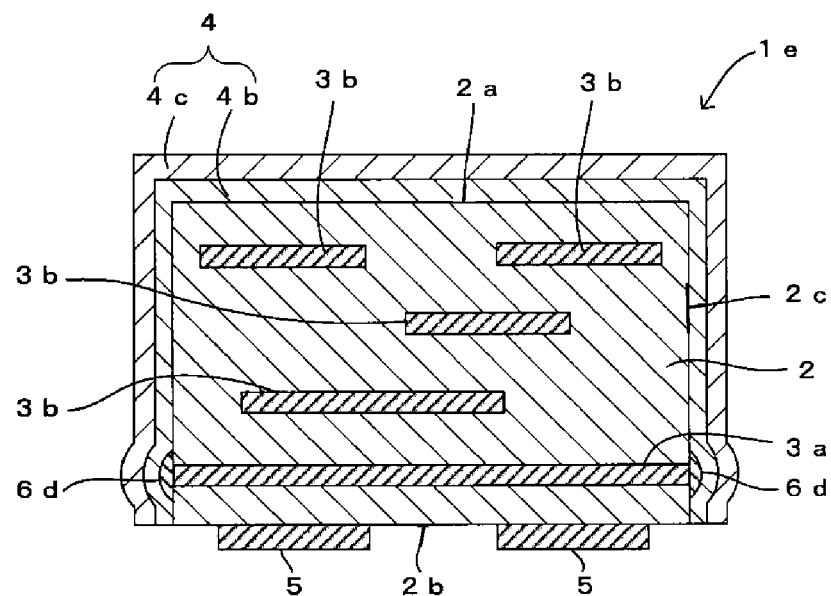

FIG. 9 is a sectional view of a high frequency component according to a fifth embodiment of the present disclosure.

Figure 10:
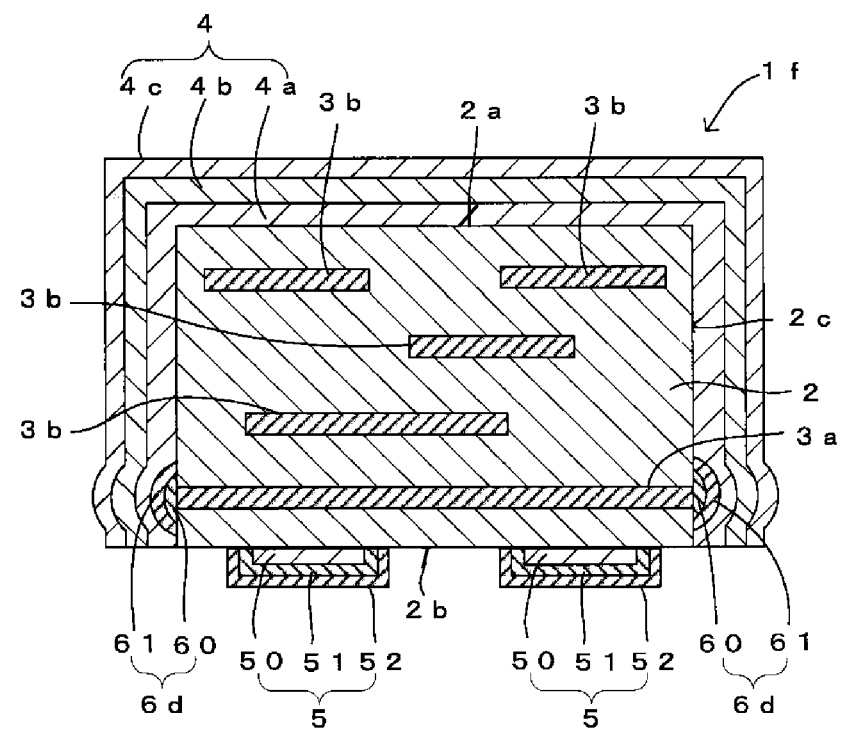

FIG. 10 is a sectional view of a high frequency component according to a sixth embodiment of the present disclosure.

Figure 11:
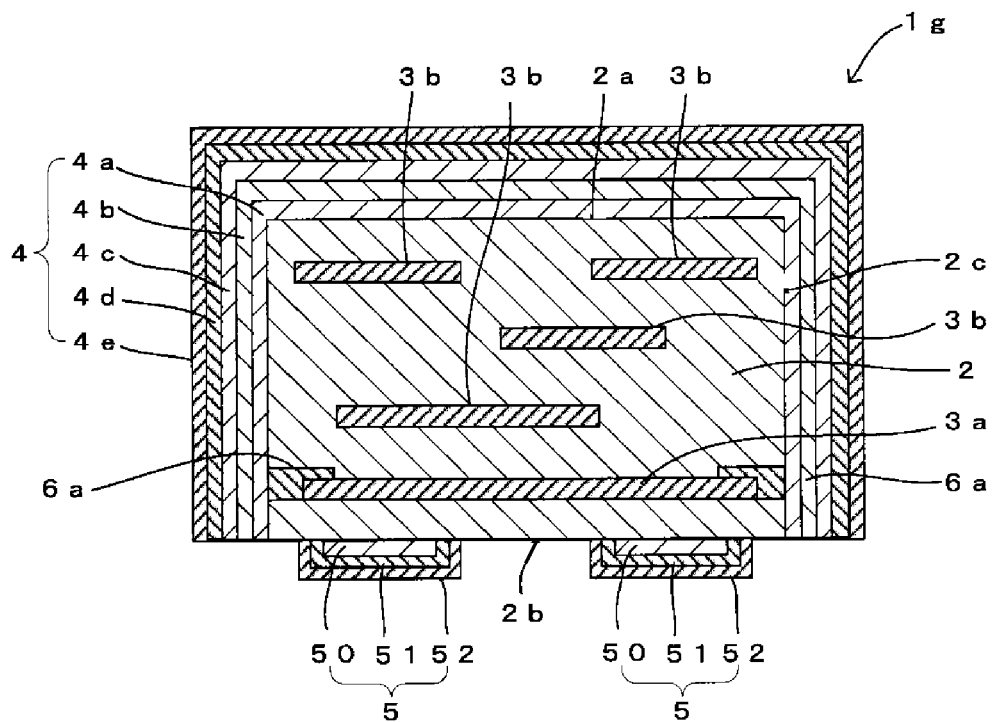

FIG. 11 is a sectional view of a high frequency component according to a seventh embodiment of the present disclosure.

Figure 12:
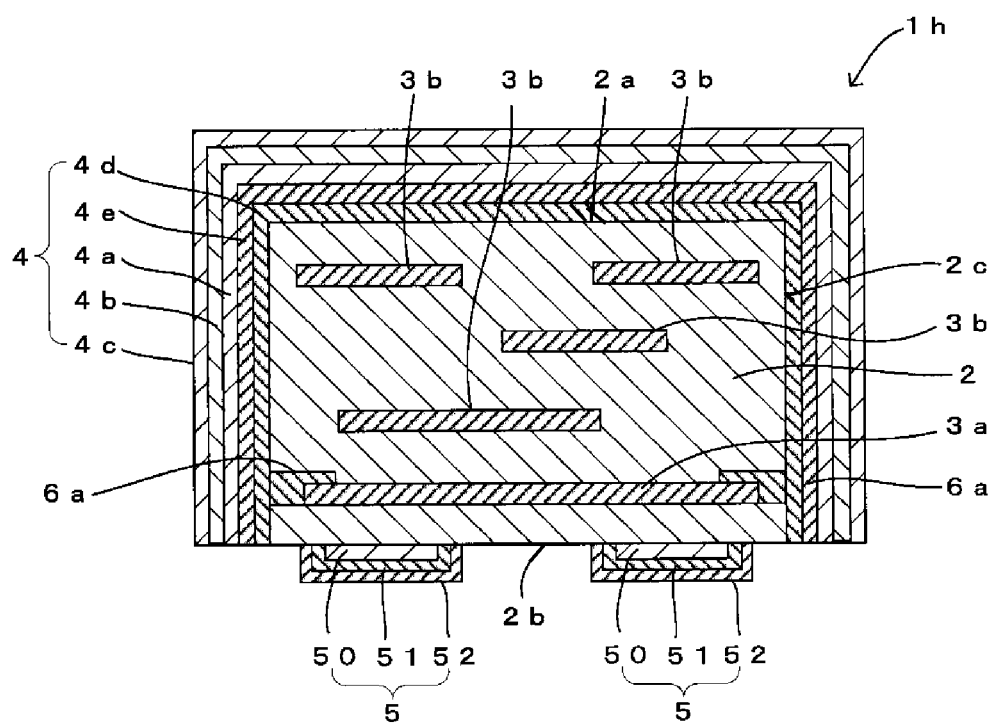

FIG. 12 is a sectional view of a high frequency component according to an eighth embodiment of the present disclosure.

Figure 13:
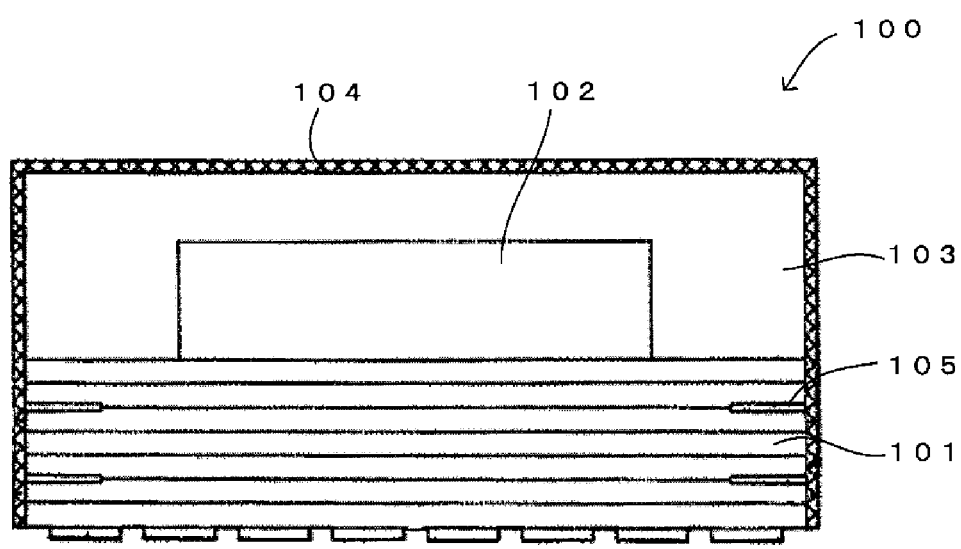

FIG. 13 is a sectional view of a high frequency component of the related art.

DETAILED DESCRIPTION OF THE DISCLOSURE

First Embodiment

A high frequency component according to a first embodiment of the present disclosure will be described below with reference to FIGS. 1 and 2. FIG. 1 is a sectional view of the high frequency component, and FIG. 2 is a plan view of a ground electrode and connecting portions.

As illustrated in FIGS. 1 and 2, the high frequency component 1a according to this embodiment includes a ceramic substrate 2, wiring electrodes 3a and 3b formed inside the ceramic substrate 2, and a shield film 4 covering the ceramic substrate 2. For example, an inductor and a capacitor are formed by the wiring electrodes 3a and 3b, thus constituting an LC filter component.

In this embodiment, the ceramic substrate 2 is a multilayer substrate including a plurality of ceramic layers laminated one above another. The ceramic layers are each made of a low temperature co-fired ceramic (LTCC) or a high temperature co-fired ceramic (HTCC). Outer electrodes 5 for external connection are formed on or in a lower surface 2b of the ceramic substrate 2. To increase the adhesion strength with respect to the ceramic layer, each of the electrodes 3a, 3b and 5 is formed, for example, using a conductive paste (also called a "common base material" hereinafter), which contains metal powder such as Cu powder, a glass ingredient that is a part of materials constituting the ceramic substrate 2, and an organic solvent. In this case, the difference in contraction timing and coefficient of linear expansion between each of the electrodes 3a, 3b and 5 and the ceramic layer in a firing process is reduced and hence the electrodes 3a, 3b and 5 are less apt to peel off from the ceramic layer in comparison with the case of using a conductive paste that is not the common base material. Ni plating and Sn plating, or Au plating may be applied to surfaces of the outer electrodes 5. The ingredient of the conductive paste called the common base material is not limited to the glass ingredient insofar as it is a part of the materials constituting the ceramic substrate. In each of the wiring electrodes 3a, 3b and 5, a weight rate of the metal ingredient (metal powder) among all inorganic ingredients (metal powder+glass ingredient) is preferably in the range of not less than 75 wt % and not more than 95 wt % in order to ensure the desired specific resistance and the adhesion strength of the electrode with respect to the ceramic substrate 2.

The wiring electrode 3a formed inside the ceramic substrate 2 is a ground electrode used for the purpose of grounding (the wiring electrode 3a being also called the ground electrode 3a hereinafter), and is connected to the predetermined one of the outer electrodes 5 through a via conductor (not illustrated). The ground electrode 3a is electrically connected to the shield film 4. More specifically, as illustrated in FIG. 2, the ceramic substrate 2 is formed in a rectangular shape when viewed in a direction perpendicular to the lower surface 2b of the ceramic substrate 2 (hereinafter also stated in another way, when viewed in plan). Furthermore, in this embodiment, the ground electrode 3a is formed in a rectangular shape smaller than that of the ceramic substrate 2 when viewed in plan, and is arranged to be positioned within the contour of the ceramic substrate 2. In other words, the ground electrode 3a is formed in a rectangular shape slightly smaller than that of the ceramic substrate 2 when viewed in plan, and is arranged at such a location that a peripheral edge of the ground electrode 3a does not reach a peripheral edge of the ceramic substrate 2.

Moreover, four connecting portions 6a electrically connecting the ground electrode 3a and the shield film 4 are formed inside the ceramic substrate 2. As illustrated in FIG. 2, those connecting portions 6a are each formed in a state partly overlapping a portion of the peripheral edge of the ground electrode 3a when viewed in plan, and bridging the peripheral edge of the ground electrode 3a and the peripheral edge of the ceramic substrate 2. In this case, an end portion (i.e., a portion reaching the peripheral edge of the ceramic substrate 2) of each connecting portion 6a is exposed at a lateral surface 2c of the ceramic substrate 2 and is connected to the shield film 4. Each connecting portion 6a is formed using a conductive paste containing the metal ingredient at a higher weight rate than each of the electrodes 3a, 3b and 5 (e.g., a pure copper-based paste not containing any of the materials constituting the ceramic substrate 2). Each connecting portion 6a may contain the glass ingredient as in the wiring electrodes 3a, 3b and 5, but a weight rate of the metal ingredient (metal powder) among all inorganic ingredients (metal powder+glass ingredient) is preferably in the range of not less than 95 wt % and not more than 100 wt % in order to realize the low connection resistance between the ground electrode 3a and the shield film 4.

(Method of Manufacturing High Frequency Component 1a)

A method of manufacturing the high frequency component 1a will be described below. The following description is made, by way of example, in connection with the case of manufacturing many high frequency components together until a step of forming the shield film 4.

First, green sheets being made of LTCC and constituting the ceramic layers are fabricated. To that end, slurry is prepared by mixing proper amounts of ceramic powder, a binder, and a plasticizer together. The green sheet is formed by coating the prepared slurry over a carrier film, and by shaping the coated slurry with sheet forming. A method of coating the slurry over the carrier film can be performed using a lip coater or a doctor blade, for example. In this embodiment, the green sheet is formed in a thickness of 5 to 100 μm.

Then, via holes are formed through the green sheet at necessary positions. The via holes can be formed by punching or laser processing, for example. In this embodiment, the via holes are each formed in a diameter of 20 to 200 μm. Then, via conductors are formed by filling a conductive paste into the via holes. The conductive paste used at that time can be formed, for example, by mixing metal powder such as Cu powder, a plasticizer, and a binder such as an organic solvent. By further adding ceramic powder to the above-mentioned conductive paste, the conductive paste containing the common base material may be prepared and used.

Then, the electrodes 3a, 3b and 5 are formed by applying a conductive paste to a principal surface of the green sheet. The conductive paste used at that time is given as the conductive paste containing the common base material, which is formed, for example, by mixing Cu powder, glass powder, a plasticizer, and a binder such as an organic solvent. The conductive paste can be applied with the technique of screen printing, ink jet printing, or gravure printing, for example.

The connecting portions 6a are formed on the green sheet on which the ground electrode 3a is to be formed. The connecting portions 6a can be formed by applying a conductive paste. The conductive paste used at that time is given, for example, as a pure copper-based conductive paste, which is obtained by mixing Cu powder, a plasticizer, and a binder such as an organic solvent, (i.e., the conductive paste not containing the common base material). The connecting portions 6a are formed in a state extending across lines between the adjacent ceramic substrates 2 along which the ceramic substrates 2 are to be cut into individual pieces, such that the end portions of the connecting portions 6a are exposed at the lateral surfaces of the ceramic substrates 2 after being cut into individual pieces. The conductive paste can be applied with the technique of screen printing, ink jet printing, or gravure printing, for example. In this embodiment, each connecting portion 6a is formed in a thickness of 1 to 30 μm. The connecting portion 6a is preferably formed in a smaller thickness from the viewpoint of preventing structural defects that may generate in the process of firing the green sheet. On the other hand, the connecting portion 6a is preferably formed in a larger thickness when it is desired to increase connection reliability of the connecting portion 6a with respect to the shield film 4 and to obtain good characteristics (e.g., EMI shield characteristics).

Each connecting portion 6a is formed in a width W (see FIG. 2) of 30 to 500 μm. From the viewpoint of preventing structural defects that may generate in the process of firing the green sheet, the connecting portion 6a is preferably formed in a smaller width W. On the other hand, when it is desired to increase the connection reliability of the connecting portion 6a with respect to the shield film 4 and to obtain good characteristics (e.g., EMI shield characteristics), the connecting portion 6a is preferably formed in a larger width W.

Then, the plurality of green sheets on and through which the electrodes 3a, 3b and 5 and the via conductors have been formed are laminated one above another, and a resulting multilayer body is pressure-bonded after putting it into a die. The pressure and temperature at that time can be optionally set.

Then, the pressure-bonded multilayer body is cut into individual pieces of the ceramic substrates 2. The multilayer body can be cut into the individual pieces with a dicing machine, a guillotine cutter, or laser processing, for example. After the cutting, barrel polishing is performed on the individual ceramic substrates 2 as required.

Then, the individual ceramic substrates 2 are arrayed on an alignment jig and are fired using a batch furnace or a belt furnace. When the Cu-based conductive paste is used, the firing is preferably performed in a reducing atmosphere (e.g., a $N_2$ atmosphere). Then, Ni plating and Sn plating, or Au plating is applied to the surfaces of the outer electrodes 5.

Then, the ceramic substrates 2 are arrayed on a tray, and the shield film 4 is formed over the ceramic substrates 2 by spin coating, whereby the high frequency component 1a is completed. For example, a conductive paste containing conductive powder, such as Cu powder, and epoxy resin can be used in the spin coating. A paste or a tape may be previously bonded to the lower surface 2b of the ceramic substrate 2 in order to prevent the conductive paste from spreading over the lower surface 2b of the ceramic substrate 2 during the spin coating. Prior to the spin coating, plasma cleaning may be performed on the lower surface 2b of the ceramic substrate 2 as required. In addition to the spin coating, spray coating or dipping can also be used as a method of forming the shield film 4.

Thus, according to the above-described embodiment, since the ground electrode 3a and the shield film 4 are connected to each other by the connecting portions 6a each containing the metal ingredient at a relatively high rate, the shield characteristics (e.g., the EMI shield characteristics) of the shield film 4 can be improved.

When the ceramic substrate 2 is fired, the temperature at the surfaces 2a to 2c of the ceramic substrate 2 becomes higher than that inside the ceramic substrate 2, and the gas contributing to the oxidation-reduction reaction is supplied to those surfaces 2a to 2c in a large amount. This results in a state that the sintering reaction at the surfaces of the ceramic substrate 2 progresses more quickly than inside the ceramic substrate 2. In the case of forming the ground electrode with the conductive paste containing the common base material, and making the end portion of the ground electrode exposed at the lateral surface of the ceramic substrate as in the related art, therefore, when the ceramic substrate is fired after being cut into the individual pieces, the glass ingredient in the end portion of the ground electrode exposed at the lateral surface of the ceramic substrate is used in the sintering reaction at the surface of the ceramic substrate 2 and is caused to flow into the ceramic substrate, thus generating a defect in the end portion of the ground electrode. Furthermore, during the firing process of the ceramic substrate, the metal powder in the conductive paste is coagulated so as to fill the defect, and a metal ball is formed in some cases. When the defect is generated or when the metal ball is formed in the end portion of the ground electrode as described above, the metal ingredient in the exposed portion of the ground electrode at the lateral surface of the ceramic substrate is reduced, and/or a contact area between the ground electrode and the shield film is reduced. This may lead to a possibility that the connection resistance between the shield film and the ground electrode increases and the shield characteristics degrade. According to this embodiment, however, since the ground electrode 3a is connected to the shield film 4 with the connecting portions 6a interposed therebetween, which are made of the conductive paste not containing the common base material, the above-described degradation of the shield characteristics can be avoided.

Furthermore, since the ground electrode 3a contains the material (glass ingredient) constituting the ceramic substrate, the contraction timing and the coefficient of linear expansion of the ground electrode 3a in the firing process can be made closer to those of the ceramic substrate 2. As a result, the ceramic substrate 2 can be prevented from peeling off from the ground electrode 3a while the shield characteristics of the shield film 4 are improved.

(Modifications of Connecting Portion)

Modifications of the connecting portion 6a will be described below with reference to FIGS. 3A and 3B. FIGS. 3A and 3B represent connecting portions 6b and 6c in the modifications, and are each a plan view corresponding to FIG. 2.

FIG. 2 represents the case in which the four connecting portions 6a are disposed and are connected to the shield film 4 at the end portions of the connecting portions 6a, which are exposed at the lateral surfaces 2c of the ceramic substrate 2. However, as illustrated in FIG. 3A by way of example, the connecting portion 6b having a ring-like shape when viewed in plan and overlapping the entire peripheral edge of the ground electrode 3a may be formed such that an end portion of the connecting portion 6b is exposed at the lateral surfaces 2c of the ceramic substrate 2 along an entire peripheral edge of the lower surface 2b of the ceramic substrate 2. With such a structure, since a connection area between the ground electrode 3a and the shield film 4 increases, the shield characteristics of the shield film 4 can be improved.

Alternatively, as illustrated in FIG. 3B, the conductive paste may be applied not to cover only four corners of the connecting portion 6b illustrated in FIG. 3A such that the connecting portion 6b is not exposed at the lateral surfaces 2c of the ceramic substrate 2 in those portions (four corners) where the conductive paste has not been applied. In the above case, since the connecting portions between the shield film 4 and the ground electrode 3a are not formed in the four corners where structural defects, such as chipping, tend to generate, the connection reliability between the shield film 4 and the ground electrode 3a can be improved.

(Modification of Ground Electrode)

In the above embodiment, the ground electrode 3a is formed such that the rectangular shape defined by the ground electrode 3a has a smaller area than the rectangular shape defined by the ceramic substrate 2. However, the ground electrode 3a may be formed in the same area as the ceramic substrate 2 to be exposed at the lateral surfaces 2c of the ceramic substrate 2 in addition to the connecting portions 6a. With such a structure, the connection between the ground electrode 3a and the shield film 4 can be reinforced.

Second Embodiment

A high frequency component 1b according to a second embodiment of the present disclosure will be described below with reference to FIGS. 5 and 6. FIG. 5 is a sectional view of the high frequency component according to this embodiment, and FIG. 6 is a plan view of a ground electrode and connecting portions in FIG. 5.

The high frequency component 1b according to the second embodiment is different from the high frequency component 1a according to the first embodiment, described above with reference to FIGS. 1 and 2, in structures of a ground electrode 3a, connecting portions 6d, and a shield film 4 as seen from FIG. 5. Other constituent elements are the same as those in the high frequency component 1a according to the first embodiment, and hence the description of those constituent elements is omitted while they are denoted by the same reference sings.

In this embodiment, as illustrated in FIG. 6, the ground electrode 3a is constituted by a body portion 3a1 having a rectangular shape with a smaller area than that defined by the ceramic substrate 2 when viewed in plan, and extended portions 3a2 formed at two positions in each of opposing two among four sides of the body portion 3a1, which define a peripheral edge of the body portion 3a1. The extended portions 3a2 are each formed to extend from the peripheral edge of the body portion 3a1 up to the peripheral edge of the ceramic substrate 2, and end portions of the extended portions 3a2 are partly exposed at the lateral surfaces 2c of the ceramic substrate 2. In this embodiment, the extended portions 3a2 are separately arranged near total four ends of the opposing two sides of the body portion 3a in a one-to-one relation. The number and the positions at which the extended portions 3a2 are arranged may be appropriately changed such as additionally forming the extended portions 3a2 at positions along the other opposing two sides of the body portion 3a1. As an alternative, the ground electrode 3a may be formed in a rectangular shape having the same size as that of the ceramic substrate 2, and the entire peripheral edge of the ground electrode 3a may be exposed at the lateral surfaces 2c of the ceramic substrate 2.

Each of the connecting portions 6d covers a partial region (corresponding to "a predetermined region" in the present disclosure) of the lateral surface 2c of the ceramic substrate 2, the partial region including a region where the end portion of the extended portion 3a2 of the ground electrode 3a is exposed, and is connected to the ground electrode 3a. In this embodiment, the connecting portions 6d are individually disposed in a one-to-one relation to the extended portions 3a2. Alternatively, one connecting portion 6d may be disposed in a state covering the entire lateral surfaces 2c of the ceramic substrate 2. In such a case, the connection reliability with respect to the shield film 4 is improved.

The shield film 4 is formed in a three-layer structure in which a close contact layer 4a, a conductive layer 4b, and a corrosion-resistant layer 4c are successively laminated starting from the side closer to the ceramic substrate 2 (i.e., from the lower layer side). For instance, the close contact layer 4a can be formed using any of metals such as SUS, Cu, Ti, Cr, Ni or TiAl. The conductive layer 4b can be formed using any of metals such as Cu, Ni, Ag or Al. The corrosion-resistant layer 4c can be formed using any of metals such as SUS, Ti, Cr or TiAl, or a metal having high permeability, such as Ni or Permalloy. When the corrosion-resistant layer 4c is formed using the metal having high permeability, the electromagnetic shielding effect of the shield film 4 increases. In this embodiment, the close contact layer 4a is made of SUS (corresponding to a "second stainless steel layer" in the present disclosure), the conductive layer 4b is made of Cu (corresponding to a "Cu layer" in the present disclosure), and the corrosion-resistant layer 4c is made of SUS (corresponding to a "first stainless steel layer" in the present disclosure). Those layers are each formed by sputtering.

(Method of Manufacturing High Frequency Component 1b)

A method of manufacturing the high frequency component 1b will be described below. Steps until obtaining the individual ceramic substrates 2 are the same as those in the method of manufacturing the high frequency component 1a according to the first embodiment except for forming the connecting portions 6d, and hence the description of those steps is omitted.

After obtaining the individual ceramic substrates 2, the same conductive paste (i.e., the pure copper-based paste) as that used to form the connecting portions 6a in the first embodiment is applied to the partial regions of the lateral surface 2c of the ceramic substrate 2, the partial regions include portions where the end portions of the extended portions 3a2 of the ground electrode 3a are exposed, thus forming the connecting portions 6d. Each of the connecting portions 6d has a thickness of about 3 to 30 μm. Preferably, the thickness of the connecting portion 6d is set to be relatively small when it is desired to reduce the size of the high frequency component 1b, and the thickness of the connecting portion 6d is set to be relatively large when importance is placed on the protection of the ground electrode 3a. While, in this embodiment, the connecting portions 6d are individually formed in a one-to-one relation to the extended portions 3a2, one connecting portion 6d may be disposed in a state covering the entire lateral surfaces 2c of the ceramic substrate 2. When the one connecting portion 6d covers the entire lateral surfaces 2c of the ceramic substrate 2, the connection reliability with respect to the shield film 4 can be improved. When the connecting portions 6d are individually formed in a one-to-one relation to the extended portions 3a2 as in the embodiment of this application, it is possible to prevent entrapment of air, which may occur when the entire lateral surfaces 2c of the ceramic substrate 2 is covered with the one connecting portion 6d.

Then, the individual ceramic substrates 2 are fired through similar procedures to those in manufacturing the high frequency component 1a according to the first embodiment.

Then, the ceramic substrates 2 after being fired are arrayed on a tray for sputtering. At that time, a paste or a tape may be previously bonded to the lower surface 2b of the ceramic substrate 2 in order to prevent a sputtering film from spreading over the lower surface 2b of the ceramic substrate 2. When the ceramic substrates 2 are arrayed on the tray, a gap between adjacent two of the ceramic substrates 2 is optionally set. In the case of setting the gap to be relatively narrow, the efficiency in forming the shield film 4 can be increased. On the other hand, in the case of setting the gap to be relatively wide, a rate of forming a film on the lateral surfaces 2c of the ceramic substrate 2 increases, whereby a film forming time can be shortened. Dry etching is performed as required before the film is formed by the sputtering. The dry etching can be performed using an Ar ion gun, for example. The dry etching is able to not only clean the ceramic substrate 2, but also to increase the adhesion strength of the shield film 4 due to roughing of the surfaces of the ceramic substrate 2.

Then, the tray for sputtering is placed into a chamber of a sputtering apparatus, and the close contact layer 4a is formed. At that time, the close contact layer 4a is formed by applying a voltage to a SUS target for a desired time. A film thickness of the close contact layer 4a formed here is preferably about 0.01 to 0.5 μm, for example.

Then, the conductive layer 4b is formed on the close contact layer 4a by sputtering. At that time, the conductive layer 4b is formed by applying a voltage to a Cu target for a desired time. A film thickness of the conductive layer 4b formed here is preferably set such that the film thickness in portions of the conductive layer 4b, the portions covering the lateral surfaces 2c of the ceramic substrate 2, is about 0.9 to 3 μm, for example.

Then, the corrosion-resistant layer 4c is formed on the conductive layer 4b by sputtering, whereby the high frequency component 1b is completed. At that time, the corrosion-resistant layer 4c is formed by applying a voltage to a SUS target for a desired time. A film thickness of the corrosion-resistant layer 4c formed here is preferably about 0.03 to 1.5 μm, for example.

The above-described sputtering in forming each of the layers 4a, 4b and 4c can be performed by inline, batch, or single-substrate processing. The above-described targets may be, in addition to metal targets, other suitable targets such as a sintered target (in the case of an alloy). When the sintered target is used, a metal ratio can be adjusted so as to obtain any desired composition, whereby the adhesion strength and the corrosion resistance can be optimized. Electric power can be supplied as DC, pulse, or RF power. In the case of using the pulse or RF power, stable discharge can be ensured even when films of reaction products (e.g., oxides and nitrides) are formed on the target surface and the resistance value is increased. Pre-sputtering for cleaning the target surface may be performed prior to forming the layers 4a, 4b and 4c.

According to this embodiment, the same effect as that in the high frequency component 1a according to the first embodiment can also be obtained with the structure in which the connecting portions 6d are formed on the lateral surfaces 2c of the ceramic substrate 2. Furthermore, since the shield film 4 is formed as the sputtered film having a lower specific resistance than the conductive paste, the shield characteristics of the shield film 4 can be easily improved.

Third Embodiment

A high frequency component 1c according to a third embodiment of the present disclosure will be described below with reference to FIG. 7. FIG. 7 is a sectional view of the high frequency component according to this embodiment.

The high frequency component 1c according to the third embodiment is different from the high frequency component 1a according to the first embodiment, described above with reference to FIGS. 1 and 2, in that the connecting portion 6e is formed of a via conductor (corresponding to a "columnar conductor" in the present disclosure) as illustrated in FIG. 7. Other constituent elements are the same as those in the high frequency component 1a according to the first embodiment, and hence the description of those constituent elements is omitted while they are denoted by the same reference sings.

In this embodiment, a connecting portion 6e has an upper end surface 6e1 (corresponding to the "other end of the columnar conductor" in the present disclosure) that is exposed at the upper surfaces 2a of the ceramic substrate 2 and is connected to the shield film 4, and a lower end surface 6e2 (corresponding to one "end of the columnar conductor" in the present disclosure) that is connected to the ground electrode 3a. The connecting portion 6e is formed using a conductive paste containing the metal ingredient at a higher weight rate than the ground electrode 3a (e.g., a pure copper-based paste). Another type of columnar conductor, such as a post electrode, may be used as the connecting portion 6e. Similar advantageous effects to those in the high frequency component 1a according to the first embodiment can also be obtained with the above-described structure.

Fourth Embodiment

A high frequency component 1d according to a fourth embodiment of the present disclosure will be described below with reference to FIG. 8. FIG. 8 is a sectional view of the high frequency component according to this embodiment.

The high frequency component 1d according to the fourth embodiment is different from the high frequency component 1a according to the first embodiment, described above with reference to FIGS. 1 and 2, in that a high frequency module is constituted, as illustrated in FIG. 8, by mounting components 7 to the upper surface 2a of the ceramic substrate 2, and by forming a resin layer 8 to encapsulate the component 7. Other constituent elements are the same as those in the high frequency component 1a according to the first embodiment, and hence the description of those constituent elements is omitted while they are denoted by the same reference sings. It is to be noted that FIG. 8 illustrates only the ground electrode 3a and the connecting portion 6a inside the ceramic substrate 2 with omission of the other wiring electrodes 3b.

In this embodiment, the components 7 are formed of, for example, an RF-IC, a chip capacitor, etc. The resin layer 8 is laminated on the upper surface 2a of the ceramic substrate 2 in a state covering the components 7. The resin layer 8 can be formed, for example, using a general encapsulation resin such as a glass epoxy resin. The shield film 4 covers the lateral surfaces 2c of the ceramic substrate 2 and surfaces of the resin layer 8.

According to this embodiment, similar advantageous effects to those in the high frequency component 1a according to the first embodiment can also be obtained with the structure in which the components 7 are mounted to the ceramic substrate 2 and the high frequency component 1d constitutes a module.

Fifth Embodiment

A high frequency component 1e according to a fifth embodiment of the present disclosure will be described below with reference to FIG. 9. FIG. 9 is a sectional view of the high frequency component 1e according to this embodiment.

The high frequency component 1e according to the fifth embodiment is different from the high frequency component 1b according to the second embodiment, described above with reference to FIGS. 5 and 6, in structure of the shield film 4 as seen from FIG. 9. Other constituent elements are the same as those in the high frequency component 1b according to the second embodiment, and hence the description of those constituent elements is omitted while they are denoted by the same reference sings.

In this embodiment, the shield film 4 does not include the close contact layer 4a disposed in the second embodiment, and it is formed in a two-layer structure in which a conductive layer 4b and a corrosion-resistant layer 4c are successively laminated starting from the side closer to the ceramic substrate 2 (i.e., from the lower layer side). The conductive layer 4b and the corrosion-resistant layer 4c in this embodiment can be formed in the same configurations as those of the conductive layer 4b and the corrosion-resistant layer 4c in the second embodiment, respectively. In this embodiment, the conductive layer 4b is made of Cu, and the corrosion-resistant layer 4c is made of SUS. With the above-described features, the corrosion of the shield film 4 can be prevented.

Sixth Embodiment

A high frequency component if according to a sixth embodiment of the present disclosure will be described below with reference to FIG. 10. FIG. 10 is a sectional view of the high frequency component if according to this embodiment.

The high frequency component if according to the sixth embodiment is different from the high frequency component 1b according to the second embodiment, described above with reference to FIGS. 5 and 6, in structures of the connecting portions 6d and the outer electrodes 5 as seen from FIG. 10. Other constituent elements are the same as those in the high frequency component 1b according to the second embodiment, and hence the description of those constituent elements is omitted while they are denoted by the same reference sings.

In this embodiment, the connecting portions 6d are each formed in a two-layer structure in which a first plating layer 60 and a second plating layer 61 are successively laminated starting from the side closer to the ceramic substrate 2 (i.e., from the lower layer side). Here, the first plating layer 60 is formed by Ni plating, and the second plating layer 61 is formed by Au plating or Sn plating.

In addition, the outer electrodes 5 are each formed in a three-layer structure in which an underlying electrode layer 50, an intermediate plating layer 51, and a surface plating layer 52 are successively laminated starting from the side closer to the ceramic substrate 2 (i.e., from the lower layer side). Here, the underlying electrode layer 50 is made of Cu or Ag, the intermediate plating layer 51 is made of Ni, and the surface plating layer 52 is made of Au or Sn.

A method of manufacturing the high frequency component if is described mainly about different points from the method of manufacturing the high frequency component 1b according to the second embodiment. After forming the ceramic substrate 2 through the same procedures (except for the outer electrodes 5) as those in the second embodiment, the underlying electrode layer 50 is first formed on the lower surface 2b of the ceramic substrate 2. The underlying electrode layer 50 can be formed, for example, by applying a Cu or Ag paste. Then, the intermediate plating layer 51 is formed by Ni plating on the underlying electrode layer 50. At that time, the first plating layer 60 is also formed by the Ni plating on the end portion of the ground electrode 3a, which is exposed at the lateral surface 2c of the ceramic substrate 2. In other words, the intermediate plating layer 51 and the first plating layer 60 are formed at the same time by the Ni plating. Then, the surface plating layer 52 is formed by Au or Sn plating on the intermediate plating layer 51. At that time, the second plating layer 61 is also formed by the Au or Sn plating on the first plating layer 60. In other words, the surface plating layer 52 and the second plating layer 61 are formed at the same time by the Au or Sn plating. Finally, the shield film 4 is formed through the same procedure (sputtering) as that in manufacturing the high frequency component 1b according to the second embodiment, whereby the high frequency component if is completed.

Similar advantageous effects to those in the high frequency component 1b according to the second embodiment can also be obtained with the above-described features. In addition, since the connecting portions 6d can be formed at the same time as forming the plating layers 51 and 52 of each of the outer electrodes 5, production efficiency can be increased.

Seventh Embodiment

A high frequency component 1g according to a seventh embodiment of the present disclosure will be described below with reference to FIG. 11. FIG. 11 is a sectional view of the high frequency component 1g according to this embodiment.

The high frequency component 1g according to the seventh embodiment is different from the high frequency component 1a according to the first embodiment, described above with reference to FIGS. 1 and 2, in structures of the shield film 4 and the outer electrodes 5 as seen from FIG. 11. Other constituent elements are the same as those in the high frequency component 1a according to the first embodiment, and hence the description of those constituent elements is omitted while they are denoted by the same reference sings.

In this embodiment, the shield film 4 is formed in a five-layer structure in which a close contact layer 4a, a conductive layer 4b, a corrosion-resistant layer 4c, a first shield plating layer 4d (corresponding to a "plating layer of the shield film" in the present disclosure), and a second shield plating layer 4e (corresponding to the "plating layer of the shield film" in the present disclosure) are successively laminated starting from the side closer to the ceramic substrate 2 (i.e., from the lower layer side). The close contact layer 4a, the conductive layer 4b, and the corrosion-resistant layer 4c have the same features as those of the shield film 4 in the second embodiment. The first shield plating layer 4d is formed by Ni plating, and the second shield plating layer 4e is formed by Au plating or Sn plating.

The outer electrodes 5 have the same structure as that in the sixth embodiment, and are each formed in a three-layer structure in which an underlying electrode layer 50, an intermediate plating layer 51, and a surface plating layer 52 are successively laminated starting from the side closer to the ceramic substrate 2 (i.e., from the lower layer side). Here, the underlying electrode layer 50 is made of Cu or Ag, the intermediate plating layer 51 is made of Ni, and the surface plating layer 52 is made of Au or Sn.

A method of manufacturing the high frequency component 1g is described mainly about different points from the method of manufacturing the high frequency component 1a according to the first embodiment. After forming the ceramic substrate 2 through the same procedures (except for the outer electrodes 5) as those in the first embodiment, the underlying electrode layer 50 is first formed on the lower surface 2b of the ceramic substrate 2. The underlying electrode layer 50 can be formed, for example, by applying a Cu or Ag paste. Then, the close contact layer 4a, the conductive layer 4b, and the corrosion-resistant layer 4c are formed through the same procedures as those in the method of manufacturing the shield film 4 in the second embodiment. Then, the intermediate plating layer 51 is formed by Ni plating on the underlying electrode layer 50. At that time, the first shield plating layer 4d is also formed by the Ni plating on the corrosion-resistant layer 4c. In other words, the intermediate plating layer 51 and the first shield plating layer 4d are formed at the same time by the Ni plating. Then, the surface plating layer 52 is formed by Au or Sn plating on the intermediate plating layer 51. At that time, the second shield plating layer 4e is also formed by the Au or Sn plating on the first shield plating layer 4d. In other words, the surface plating layer 52 and the second shield plating layer 4e are formed at the same time by the Au or Sn plating. The high frequency component 1g is completed with the above Au or Sn plating. Alternatively, in this embodiment, the shield film 4 may be formed by successively laminating, on the ceramic substrate 2, the conductive layer 4b, the corrosion-resistant layer 4c, the first shield plating layer 4d, and the second shield plating layer 4e in the mentioned order without forming the close contact layer 4a.

This embodiment can also provide similar advantageous effects to those in the high frequency component 1a according to the first embodiment.

Eighth Embodiment

A high frequency component 1h according to an eighth embodiment of the present disclosure will be described below with reference to FIG. 12. FIG. 12 is a sectional view of the high frequency component 1h according to this embodiment.

The high frequency component 1h according to the eighth embodiment is different from the high frequency component 1g according to the seventh embodiment, described above with reference to FIG. 11, in the structure of the shield film 4 as seen from FIG. 12. Other constituent elements are the same as those in the high frequency component 1g according to the seventh embodiment, and hence the description of those constituent elements is omitted while they are denoted by the same reference sings.

In this embodiment, the shield film 4 is formed by carrying out film formation with sputtering after plating. More specifically, the shield film 4 is formed in a five-layer structure in which a first shield plating layer 4d (corresponding to the "plating layer of the shield film" in the present disclosure), a second shield plating layer 4e (corresponding to the "plating layer of the shield film" in the present disclosure), a close contact layer 4a, a conductive layer 4b, and a corrosion-resistant layer 4c are successively laminated starting from the side closer to the ceramic substrate 2 (i.e., from the lower layer side).

A method of manufacturing the high frequency component 1h is described mainly about different points from the method of manufacturing the high frequency component 1g according to the seventh embodiment. First, the ceramic substrate 2 and the underlying electrode layer 50 on the lower surface 2b of the ceramic substrate 2 are formed through the same procedures as those in the seventh embodiment. Then, the intermediate plating layer 51 is formed by Ni plating on the underlying electrode layer 50. At that time, the first shield plating layer 4d is also formed by the Ni plating on the upper surface 2a and the lateral surfaces 2c of the ceramic substrate 2. In other words, the intermediate plating layer 51 and the first shield plating layer 4d are formed at the same time by the Ni plating. Then, the surface plating layer 52 is formed by Au or Sn plating on the intermediate plating layer 51. At that time, the second shield plating layer 4e is also formed by the Au or Sn plating on the first shield plating layer 4d. In other words, the surface plating layer 52 and the second shield plating layer 4e are formed at the same time by the Au or Sn plating. Finally, the close contact layer 4a, the conductive layer 4b, and the corrosion-resistant layer 4c are formed through the same procedures as those in the method of manufacturing the shield film 4 in the seventh embodiment. As a result, the high frequency component 1h is completed. Alternatively, in this embodiment, the shield film 4 may be formed by successively laminating the conductive layer 4b and the corrosion-resistant layer 4c on the second shield plating layer 4e in the mentioned order without forming the close contact layer 4a.

This embodiment can also provide similar advantageous effects to those in the high frequency component 1g according to the seventh embodiment.

It is to be noted that the present disclosure is not limited to the above embodiments, and that the present disclosure can be variously modified in other ways than described above insofar as not departing from the gist of the present disclosure. For instance, the features of the above embodiments and modifications may be combined with each other as appropriate.

Furthermore, the shield film 4 in each of the above embodiments may be formed using any of a conductive paste and a sputtered film.

While the above embodiments have been described in connection with the case in which the ground electrode 3a is formed using the conductive paste containing the common base material, the conductive paste containing the common base material is not always required to be used insofar as the weight ratio of the metal ingredient in each of the connecting portions 6a to 6e is higher than that of the metal ingredient in the ground electrode 3a.

The present disclosure can be applied to various high frequency components each including a ceramic substrate and a shield layer.

1a to 1h high frequency component
2 ceramic substrate
3a ground electrode
4 shield film
4a close contact layer (second stainless steel layer)
4b conductive layer (Cu layer)
4c corrosion-resistant layer (first stainless steel layer)
4d first shield plating layer 4d (plating layer of shield film)
4e second shield plating layer 4e (plating layer of shield film)
5 outer electrode
6a to 6e connecting portion
60 first plating layer (plating layer of connecting portion)
61 second plating layer (plating layer of connecting portion)

The invention claimed is:

1. A high frequency component comprising:
a ceramic substrate;
a ground electrode disposed inside the ceramic substrate;
a shield film covering at least a lateral surface among surfaces of the ceramic substrate; and
a connecting portion connecting the ground electrode and the shield film to each other,
wherein a weight ratio of a metal ingredient in the connecting portion is higher than a weight ratio of a metal ingredient in the ground electrode,
the connecting portion is disposed inside of the shield film.

2. The high frequency component according to claim 1, wherein an end portion of the ground electrode is exposed at the lateral surface of the ceramic substrate, and
the connecting portion covers a predetermined region of the lateral surface of the ceramic substrate, the predetermined region including a region where the end portion of the ground electrode is exposed.

3. The high frequency component according to claim 2, wherein the connecting portion comprises a plating layer.

4. The high frequency component according to claim 2, wherein the shield film covers the lateral surface and one principal surface of the ceramic substrate, and the ceramic substrate includes an outer electrode provided on or in another principal surface of the ceramic substrate.

5. The high frequency component according to claim 2, wherein the ground electrode contains a material forming the ceramic substrate.

6. The high frequency component according to claim 1, wherein the ground electrode contains a material forming the ceramic substrate.

7. The high frequency component according to claim 1, wherein the weight ratio of the metal ingredient among inorganic ingredients in the connecting portion is not less than 95 wt % and not more than 100 wt %, and the weight ratio of the metal ingredient among inorganic ingredients in the ground electrode is not less than 75 wt % and not more than 95 wt %.

8. The high frequency component according to claim 1, wherein the shield film has a structure in which a plating layer, a Cu layer, and a stainless steel layer are successively laminated in this order starting from a lower layer side toward an upper layer side.

9. The high frequency component according to claim 1, wherein the shield film has a structure in which a Cu layer and a first stainless steel layer are successively laminated in this order starting from a lower layer side toward an upper layer side.

10. The high frequency component according to claim 9, wherein the shield film has a structure in which a second stainless steel layer is further laminated on a lower layer side of the Cu layer.

11. The high frequency component according to claim 1, wherein the shield film has a structure in which a Cu layer, a stainless steel layer, and a plating layer are successively laminated in this order starting from a lower layer side toward an upper layer side.

12. The high frequency component according to claim 1, wherein the connecting portion is arranged inside the ceramic substrate in a state of an end portion of the connecting portion being exposed at the lateral surface of the ceramic substrate.

13. The high frequency component according to claim 12, wherein the ground electrode contains a material forming the ceramic substrate.

14. The high frequency component according to claim 12, wherein the shield film covers the lateral surface and one principal surface of the ceramic substrate, and the ceramic substrate includes an outer electrode provided on or in another principal surface of the ceramic substrate.

15. The high frequency component according to claim 1, wherein the connecting portion comprises a columnar conductor having one end connected to the ground electrode and another end connected to the shield film.

16. The high frequency component according to claim 15, wherein the shield film covers the lateral surface and one principal surface of the ceramic substrate, and the ceramic substrate includes an outer electrode provided on or in another principal surface of the ceramic substrate.

17. The high frequency component according to claim 15, wherein the ground electrode contains a material forming the ceramic substrate.

18. The high frequency component according to claim 1, wherein the shield film covers the lateral surface and one principal surface of the ceramic substrate, and the ceramic substrate includes an outer electrode provided on or in another principal surface of the ceramic substrate.

19. The high frequency component according to claim 18, wherein the ground electrode contains a material forming the ceramic substrate.

* * * * *

UNITED STATES PATENT AND TRADEMARK OFFICE
CERTIFICATE OF CORRECTION

PATENT NO. : 10,770,223 B2
APPLICATION NO. : 16/156184
DATED : September 8, 2020
INVENTOR(S) : Issei Yamamoto Page 1 of 1

It is certified that error appears in the above-identified patent and that said Letters Patent is hereby corrected as shown below:

In the Specification

Column 13, Line 8, "component if according" should be -- component 1f according --.

Column 13, Line 11, "component if according" should be -- component 1f according --.

Column 13, Line 13, "component if according" should be -- component 1f according --.

Column 13, Line 39, "if is described mainly" should be -- "1f is described mainly --.

Column 13, Line 63, "component if is completed." should be -- component 1f is completed. --.

Signed and Sealed this
Sixteenth Day of March, 2021

Drew Hirshfeld
*Performing the Functions and Duties of the
Under Secretary of Commerce for Intellectual Property and
Director of the United States Patent and Trademark Office*